United States Patent
Yoshida et al.

(10) Patent No.: US 6,551,527 B2
(45) Date of Patent: Apr. 22, 2003

(54) CONDUCTIVE PASTE COMPRISING N-ACYLAMINO ACID

(75) Inventors: Hiroshi Yoshida, Ohnojo (JP); Takashi Endo, Chikushino (JP); Miyuki Mori, Chikushino (JP)

(73) Assignee: Shoei Chemical Inc., Tokyo (JP)

( * ) Notice: Subject to any disclaimer, the term of this patent is extended or adjusted under 35 U.S.C. 154(b) by 65 days.

(21) Appl. No.: 09/923,056

(22) Filed: Aug. 6, 2001

(65) Prior Publication Data
US 2002/0047109 A1 Apr. 25, 2002

(30) Foreign Application Priority Data
Aug. 29, 2000 (JP) ......................................... 2000-259614

(51) Int. Cl.7 ................................................. H01B 1/22
(52) U.S. Cl. ....................................................... 252/512
(58) Field of Search .............................. 252/512, 513, 252/514

(56) References Cited

U.S. PATENT DOCUMENTS 3,711,428 A    1/1973  Aycock et al.
6,447,571 B1 *  9/2002  Ito et al. ........................ 75/255

FOREIGN PATENT DOCUMENTS

| EP | 1184881 | * | 3/2002 |
|----|---------|---|--------|
| JP | 62-1807 |   | 1/1987 |
| JP | 05-242726 |   | 9/1993 |
| JP | 09-162065 |   | 6/1997 |
| JP | 10-092226 |   | 4/1998 |
| JP | 2000-231828 |   | 8/2000 |
| JP | 2002-75051 | * | 3/2002 |
| WO | WO00/03823 | * | 1/2000 |

* cited by examiner

Primary Examiner—Mark Kopec
(74) Attorney, Agent, or Firm—Flynn, Thiel, Boutell & Tanis, P.C.

(57) ABSTRACT

A conductive paste comprising a conductive powder, an organic binder and a solvent as principal components, wherein the paste also contains at least one selected from the group consisting of N-acylamino acids and salts thereof. The conductive paste has a greatly improved storability without causing separating out or precipitation of the conductive powder even after storing for a prolonged period of time.

4 Claims, No Drawings

CONDUCTIVE PASTE COMPRISING N-ACYLAMINO ACID

BACKGROUND OF THE INVENTION

1. Field of the Invention

The present invention relates to a conductive paste suitable for forming a thick film conductor for an electronic component, a circuit board or the like by firing at high temperature. More particularly, the present invention relates to a conductive paste ideally used for forming internal electrodes or terminal electrodes of a multilayered ceramic electronic component such as a multilayered ceramic capacitor or a multilayered inductor.

2. Description of the Related Art

A multilayered ceramic capacitor is produced by alternately laminating unfired dielectric layers and internal electrode layers, co-firing the laminate so obtained at high temperature, and then printing on a terminal electrode at either end. In recent years, there have been strong demands to both increase the capacity and reduce the size of such capacitors, and progress is thus being made in making both the dielectric layers and the internal electrode layers thinner. Moreover, the configuration of the terminal electrodes greatly affects the properties and the external dimensions of the component, and hence making the printed configuration of the terminal electrodes uniform is also an important problem.

Moving on, with regard to the conductive pastes used for the internal electrodes and terminal electrodes, there has been a problem that the conductive powder contained therein may separate out and precipitate upon prolonged storage. In particular, in the case of a base metal paste that uses a powder of a base metal such as nickel or copper as the conductive component, binder removal must be carried out in a non-oxidizing atmosphere, and hence the organic binder, i.e. the resin component used as a thickener, cannot be included in the paste in a large quantity, and thus the solvent content must be high, resulting in separating out and precipitation (or sedimentation) of the conductive powder becoming prone to occur. Moreover, to make the electrode layers thin, a low viscosity paste having a low conductive powder content must be used, further increasing the tendency of the conductive powder to separate out and precipitate. Especially, highly-crystallized spherical conductive metal powder having good dispersibility, which has been prepared, for example, by the spray pyrolysis process as proposed in Japanese Patent Application Laid-Open No. 62-1807 or by pyrolyzing a metal compound powder dispersed at a low concentration in a gas phase as proposed in Japanese Patent Application No. 2000-133576 or 2001-108533, is useful for forming a fired film with high packability which results in a microstructually densified and highly conductive thin film. However, once separating out and precipitation of such highly-crystallized spherical powder has occurred in the paste, the powder tends to form a hard cake with a small precipitation volume and the resultant cake is difficult to redisperse. Furthermore, if a petroleum solvent is used as the solvent, then large changes occur over time, and separating out and precipitation becomes yet more prone to occur.

If a paste in which the conductive powder has separated out is sufficiently mixed then a state can be achieved in which the conductive powder appears to have been redispersed, but the paste cannot be returned to its original state. Specifically, the dispersed conductive powder once again agglomerates, resulting in inconveniences such as a deterioration in the surface state of the dried paste film and the packability of the conductive powder, changes in the rheological properties of the paste such as the viscosity, and changes in the printability, leading to changes in the printed configuration and a loss of smoothness. In the case of internal electrodes, such inconveniences can lead to shorting between the dielectric layers and a drop in the capacity of the capacitor after firing, and to problems such as structural defects during the firing process. Moreover, in the case of terminal electrodes, problems such as nonuniformity in the electrode configuration leading to the electrode disruption or inadequacies in the printed configuration such as draping may be caused.

An example of means of resolving these problems is to add a specific compound such as tolyltriazole as reported in Japanese Patent Application Laid-open No. 9-162065, but adequate effects are not necessarily obtained.

Moreover, Japanese Patent Application Laid-open No. 5-242726 discloses the idea of adding an organic nitrogen compound that forms a chelate complex with the metal powder to prevent changes in the conductive paste over time, but there is virtually no effect in preventing precipitation of the metal powder.

Moreover, Japanese Patent Application Laid-open No. 10-92226 discloses the idea of adding a phosphoric ester type or sulfuric ester type anionic surfactant, thus promoting wetting between the conductive powder and the vehicle so that uniform, smooth, thin electrode layers can be formed. However, the effect of preventing separating out and precipitation of the conductive powder over time is inadequate, and moreover phosphorus or sulfur remains in the electrodes as an impurity, adversely affecting the electrical properties and reliability of the capacitor.

SUMMARY OF THE INVENTION

An object of the present invention is to prevent separating out and precipitation of a conductive powder from a paste over time, allowing the paste properties at the time of manufacture to be maintained for a prolonged period of time.

The present invention provides a conductive paste comprising a conductive powder, an organic binder and a solvent as principal components and also containing at least one selected from the group consisting of N-acylamino acids and salts thereof. Moreover, also provided is the above-mentioned conductive paste wherein the total amount added of N-acylamino acids and salts thereof is 0.2 to 5.0 parts by weight per 100 parts by weight of the conductive powder, and the above-mentioned conductive paste wherein the conductive powder comprises at least one selected from the group consisting of nickel, copper and alloys thereof. Moreover, also provided is the above-mentioned conductive paste, additionally containing at least one selected from the group consisting of glasses, metal oxides and ceramics.

DESCRIPTION OF THE PREFERRED EMBODIMENTS

In the present invention, a commonly used conductive powder such as a precious metal powder of silver, palladium, gold, platinum or the like or a base metal powder of nickel, copper, cobalt or the like is used. The conductive powder may either be a powder of one such metal alone, or any powder of an alloy, a composite and a mixture of such metals. Moreover, a metal-inorganic composite powder in which an inorganic material such as metal oxide, glass or ceramic is made to exist on the surface of a metal powder, or a metal-inorganic composite powder in which a conductive metal is coated onto a powder of metal oxide, glass, ceramic or the like or a powder of another metal, can also be used.

There are no particular limitations on the organic binder and the solvent, with it being possible to select ones commonly used for the vehicle of a conductive paste as deemed appropriate. Examples of the organic binder include celluloses, acrylic resins, phenol resins, alkyd resins and rosin esters. Examples of the solvent include organic solvents such as alcohols, ethers, esters and hydrocarbons, and also water, and mixed solvents thereof. Moreover, other things commonly added such as plasticizers, dispersants such as higher fatty acids or fatty acid esters, and surfactants can be included as deemed appropriate.

In addition to the above-mentioned components, commonly included inorganic components, for example inorganic binders such as glass frit, metal oxides such as barium titanate, titanium oxide, alumina, silica, copper oxide and manganese oxide, a ceramic powder having the same nature as the dielectric layers, and montmorillonites, can be added to the conductive paste of the present invention as deemed appropriate in accordance with the usage.

Each N-acylamino acid used in the present invention is an amino acid having an acyl group bonded to the nitrogen atom thereof. The acyl group is preferably a long chain fatty acid residue having about 8 to 18 carbon atoms, for example a lauroyl group, a myristoyl group, a stearoyl group, an oleoyl group, a decanoyl group, a palmitoyl group, or a natural oil/fat type fatty acid acyl group such as a coconut oil fatty acid acyl (hereinafter referred to as 'cocoyl') group. Examples of the amino acid part include N-methylglycine, N-methyl-β-alanine, aspartic acid and glutamic acid. Examples of salts of N-acylamino acids that may be used include potassium salts and sodium salts. An N-acylglutamic acid or a salt thereof is preferably used in the present invention. A number of N-acylamino acids as described above or salts thereof may be used together.

One or more of the N-acylamino acids and salts thereof (hereinafter referred to as the 'N-acylamino acid component') may be added to the paste in any form. Possible methods include surface treating the conductive powder with the N-acylamino acid component in advance, adding the N-acylamino acid component when mixing the conductive powder and the binder component together and then kneading to produce a paste, or dissolving the N-acylamino acid component in a diluting solvent and then adding the resulting solution after the paste has been produced.

There are no particular limitations on the amount added of the N-acylamino acid component, but the total amount added is preferably in the range 0.2 to 5.0 parts by weight per 100 parts by weight of the conductive powder. If this amount is less than 0.2 parts by weight, then the effect of preventing separating out and precipitation will be insufficient, whereas if this amount is greater than 5.0 parts by weight, then because of the increase in the amount of organic matter, i.e. the increase in the nonvolatile component, problems such as a drop in the density of the dried film or an insufficient binder removal may be caused.

The effect of adding the N-acylamino acid component is especially notable in a low viscosity paste containing a large amount of the vehicle. In particular, adding the N-acylamino acid component is extremely effective in the case of a low viscosity base metal paste in which the conductive powder content is no more than 15 vol % relative to the total volume of the conductive powder and the vehicle components. Further, the N-acylamino acid component exerts its effect in preventing the separation or precipitation of powder even when it is added to a paste comprising highly-crystallized spherical conductive metal powder having good dispersibility and packability. Thanks to such effects, highly-crystallized spherical metal powder prepared, for example, by pyrolysis processes as described in the above Japanese Patent Application Laid-Open No. 62-1807 or Japanese Patent Application No. 2000-133576 or 2001-108533, can successfully provide a highly densified conductive film by firing, while retaining its favorable properties without suffering from the above-mentioned separation or precipitation problem. The mean particle size of the conductive powder used in this invention is preferably not more than 10 μm. However, this invention is not limited only to such pastes.

The present invention will now be described more specifically through examples.

EXAMPLE 1

0.5 part by weight of N-stearoyl-L-glutamic acid, 5 parts by weight of ethyl cellulose and 95 parts by weight of dihydroterpineol were added to 100 parts by weight of nickel powder, and a nickel paste was prepared using a three roll mill. The nickel powder used in the paste had been prepared by spray pyrolysis and was a highly-crystallized spherical powder having a mean particle size of 1 μm. The paste so obtained was sealed in a vessel and stored for 1 week in a constant temperature bath at 50° C., and then the state of separating out was observed. It was found that separating out had hardly occurred at all. Moreover, to investigate the change over time in the packability of the nickel powder in a dried film, a paste only just manufactured and a paste stored as above and then stirred were each cast onto a PET (polyethylene terephthalate) film, drying was carried out at 150° C., and then the densities of the dried films were measured. It was found that the density was 5.6 g/cm$^3$ in both cases, i.e. that the paste properties had not changed over time.

COMPARATIVE EXAMPLE 1

A nickel paste having the same composition as in Example 1 but without the addition of N-stearoyl-L-glutamic acid was prepared. As in Example 1, the paste was sealed in a vessel and stored for 1 week at 50° C., and then the state of separating out and the change in the dried film density were investigated. After the storage, the paste had separated into 2 layers, with the volume of the precipitated nickel powder accounting for 38% of the total volume of the paste (this proportion shall hereinafter be referred to as the 'nickel precipitation volume percentage'). The nickel precipitation volume percentage relative to the total volume of paste shows the degree or area of distribution of nickel powder in the paste and a high percentage means that a large part of the volume of the paste is occupied by nickel powder and the degree of separation or precipitation of the powder is small. Even when thorough redispersion was carried out by stirring after the storage, the dried film density had still dropped to 4.9 g/cm$^3$ compared with 5.5 g/cm$^3$ for the paste immediately after preparation.

EXAMPLES 2 TO 8

5 parts by weight of ethyl cellulose, 95 parts by weight of dihydroterpineol, 20 parts by weight of barium titanate and an amount of N-stearoyl-L-glutamic acid as shown in Table 1 were added to 100 parts by weight of nickel powder, and a nickel paste was prepared using a three roll mill. As in Example 1, the paste so obtained was sealed and stored, and the state of separating out and the change in the dried film density after the storage were investigated. The results are shown in Table 1. When separating out is not observed at all, the nickel precipitation volume percentage is 100%.

COMPARATIVE EXAMPLE 2

A nickel paste having the same composition as in Example 2 but without the addition of N-stearoyl-L-glutamic acid was prepared. The changes over time in the paste properties were investigated as described above. The results are shown in Table 1.

COMPARATIVE EXAMPLES 3 TO 7

Nickel pastes having the same composition as in Example 2, but with the addition of 0.5 part by weight of oleic acid, an N-alkyl-1,3-diaminopropaneadipic acid salt (wherein the alkyl group has 8 to 16 carbon atoms), sorbitan monooleate, a fatty acid ester type dispersant or a phosphoric ester type dispersant added in place of the N-stearoyl-L-glutamic acid, were prepared. The changes over time in the paste properties were investigated as described above. The results are shown in Table 1.

It can be seen from Table 1 that the storability of the pastes containing N-stearoyl-L-glutamic acid is better than the storability of the pastes not containing N-stearoyl-L-glutamic acid, with separating out of the metal powder and changes in the paste properties over time not occurring with the pastes containing N-stearoyl-L-glutamic acid.

EXAMPLE 9

0.5 part by weight of N-cocoyl-L-glutamic acid, 7 parts by weight of ethyl cellulose, 18 parts by weight of octyl alcohol and 75 parts by weight of normal decane were added to 100 parts by weight of nickel powder, and a nickel paste was prepared using a three-roll mill. As in Example 1, the paste so obtained was sealed and stored for 1 week at 50° C., and then the state of separating out and the change in the dried film density of the paste were investigated.

COMPARATIVE EXAMPLE 8

A nickel paste having the same composition as in Example 9 but without the addition of N-cocoyl-L-glutamic acid was prepared. The changes in the paste properties were investigated as described above.

EXAMPLES 10 TO 12

7 parts by weight of ethyl cellulose, 18 parts by weight of octyl alcohol, 75 parts by weight of normal decane, 20 parts by weight of barium titanate and an amount of N-cocoyl-L-glutamic acid as shown in Table 2 were added to 100 parts by weight of nickel powder, and a nickel paste was prepared using a three-roll mill. The changes over time in the paste properties were investigated as described above.

TABLE 1

| | Amount of barium titanate powder added (part by weight) | Amount of N-stearoyl-L-glutamic acid added (part by weight) | Immediately after preparation Dried film density (g/cm³) | After storing for 1 week at 50° C. | |
|---|---|---|---|---|---|
| | | | | Dried film density (g/cm³) | Nickel precipitation volume percentage (%) |
| Example 1 | — | 0.5 | 5.6 | 5.6 | 98 |
| Comparative Example 1 | — | — | 5.5 | 4.9 | 38 |
| Example 2 | 20 | 0.1 | 5.9 | 5.6 | 82 |
| Example 3 | 20 | 0.2 | 6.0 | 5.9 | 99 |
| Example 4 | 20 | 0.5 | 6.0 | 6.0 | 97 |
| Example 5 | 20 | 1.0 | 5.9 | 6.0 | 98 |
| Example 6 | 20 | 2.0 | 6.0 | 6.1 | 98 |
| Example 7 | 20 | 4.0 | 5.9 | 5.9 | 99 |
| Example 8 | 20 | 5.0 | 5.6 | 5.5 | 98 |
| Comparative Example 2 | 20 | — | 6.0 | 5.3 | 35 |
| Comparative Example 3 | 20 | (0.5 part by weight of oleic acid) | 6.0 | 5.4 | 42 |
| Comparative Example 4 | 20 | (0.5 part by weight of N-alkyl-1,3-diaminopropane adipic acid salt (alkyl group has 8 to 16 carbon atoms)) | 5.9 | 5.3 | 37 |
| Comparative Example 5 | 20 | (0.5 part by weight of sorbitan monooleate) | 5.8 | 5.1 | 39 |
| Comparative Example 6 | 20 | (0.5 part by weight of fatty acid ester) | 5.8 | 5.2 | 35 |
| Comparative Example 7 | 20 | (0.5 part by weight of phosphoric ester) | 6.0 | 5.1 | 40 |

COMPARATIVE EXAMPLE 9

A nickel paste having the same composition as in Example 10 but the addition of the N-cocoyl-L-glutamic acid was prepared. The changes over time in the paste properties were investigated as described above.

The results for Examples 9 to 12 and Comparative Examples 8 and 9 are shown in Table 2.

low viscosity paste having a high solvent content or a paste comprising spherical conductive metal powder having good dispersibility and high packability can be stored stably, and hence demands for electrodes to be made thinner can be met; for example, in the case of a multilayered ceramic capacitor, it is easy to form thin internal electrodes of thickness of the order of 1 to 2 $\mu$m stably.

TABLE 2

|  | Amount of barium titanate powder added (part by weight) | Amount of N-cocoyl-L-glutamic acid added (part by weight) | Immediately after preparation Dried film density (g/cm$^3$) | After storing for 1 week at 50° C. | |
| --- | --- | --- | --- | --- | --- |
|  |  |  |  | Dried film density (g/cm$^3$) | Nickel precipitation volume percentage (%) |
| Example 9 | — | 0.5 | 5.1 | 5.0 | 100 |
| Comparative Example 8 | — | — | 5.1 | 4.5 | 46 |
| Example 10 | 20 | 0.2 | 5.3 | 5.2 | 98 |
| Example 11 | 20 | 1.0 | 5.4 | 5.2 | 100 |
| Example 12 | 20 | 4.0 | 5.1 | 5.0 | 100 |
| Comparative Example 9 | 20 | — | 5.2 | 4.5 | 42 |

The conductive paste of the present invention has a greatly improved storability compared with conventional conductive pastes, with separating out and precipitation of the conductive powder not occurring even after storing for a prolonged period of time. As a result, the paste properties at the time of manufacture are maintained for a prolonged period of time, with worsening of printability or changes in the printed configuration over time not occurring, and moreover the packability of the conductive powder in the dried paste film not lowering and the surface state not worsening. The conductive paste of the present invention is thus extremely useful for forming electrodes and conductor circuits with no fluctuations in properties. Moreover, even a

What is claimed is:

1. A conductive paste comprising a conductive powder, an organic binder and a solvent as principal components, wherein the paste also contains at least one selected from the group consisting of N-acylamino acids and salts thereof.

2. The conductive paste according to claim 1, wherein the total amount added of said N-acylamino acids and salts thereof is 0.2 to 5.0 parts by weight per 100 parts by weight of said conductive powder.

3. The conductive paste according to claim 1, wherein said conductive powder comprises at least one selected from the group consisting of nickel, copper and alloys thereof.

4. The conductive paste according to claim 1, wherein the paste additionally contains at least one selected from the group consisting of glasses, metal oxides and ceramics.

* * * * *